United States Patent [19]

Micic et al.

[11] Patent Number: 5,059,979
[45] Date of Patent: Oct. 22, 1991

[54] DIGITAL CONTROL CIRCUIT FOR TUNING SYSTEMS WITH A PULSE DENSITY MODULATION DIGITAL TO ANALOG CONVERTER

[75] Inventors: Ljubomir Micic, Freiburg, Fed. Rep. of Germany; Daniel Mlynek, Grand Vaux, France; Ulrich Sieben; Klaus Heberle, both of Klaus, Fed. Rep. of Germany

[73] Assignee: Deutsche ITT Industries GmbH, Freiburg, Fed. Rep. of Germany

[21] Appl. No.: 538,954

[22] Filed: Jun. 15, 1990

[30] Foreign Application Priority Data

Jul. 6, 1989 [EP] European Pat. Off. ........... 89112332

[51] Int. Cl.$^5$ ............................................. H03M 1/86
[52] U.S. Cl. ................................... 341/152; 341/144; 455/182; 455/186; 358/195.1; 331/17
[58] Field of Search ............... 358/191.1, 193.1, 195.1; 455/182, 183, 185, 186, 260, 264; 331/16, 17; 341/144, 145, 152

[56] References Cited

U.S. PATENT DOCUMENTS

| | | | |
|---|---|---|---|
| 4,087,813 | 5/1978 | Minner et al. ................... | 341/152 X |
| 4,127,822 | 11/1978 | Mogi et al. ....................... | 455/186 X |
| 4,318,130 | 3/1982 | Heuer .............................. | 455/186 X |
| 4,380,742 | 4/1983 | Hart .................................. | 331/17 X |
| 4,410,860 | 10/1983 | Kipp et al. .......................... | 331/1 A |
| 4,450,518 | 5/1984 | Klee ................................. | 455/182 X |
| 4,479,248 | 10/1984 | Caspari et al. ................... | 455/186 X |
| 4,533,879 | 8/1985 | Sauer et al. ....................... | 331/17 X |
| 4,544,911 | 10/1985 | Altman et al. ..................... | 341/118 |
| 4,595,910 | 6/1985 | Wine ................................. | 341/142 |
| 4,810,974 | 3/1989 | Hulbert et al. .................... | 331/1 A |
| 4,817,195 | 3/1989 | Kubo et al. ....................... | 358/195.1 X |

FOREIGN PATENT DOCUMENTS

| | | |
|---|---|---|
| 2636150 | 1/1978 | Fed. Rep. of Germany . |
| 3427852 | 2/1985 | Fed. Rep. of Germany . |
| 2144005 | 2/1985 | United Kingdom . |
| WO87/07794 | 12/1987 | World Int. Prop. O. . |

OTHER PUBLICATIONS

ITT Semiconductors, "SAA 1290, Remote-Control and Tuning IC for TV Receivers", Jul. 1986, Order No. 6251-222-5E.

*Primary Examiner*—Howard L. Williams
*Attorney, Agent, or Firm*—Thomas L. Peterson

[57] ABSTRACT

A digital control circuit with a device for generating a high-resolution tuning voltage is suitable for use in receivers for RF signals, particularly in consumer equipment. The tuning voltage can be electronically switched from one value to another at a high speed. The transient time required with conventional control loops is nearly eliminated since the low-pass filter or the digital integrator is preset to its steady-state integration value. To generate the tuning voltage, dynamic digital-to-analog convertors are provided which, despite their high resolution, require only a smoothing filter with a short response time and a short time constant.

27 Claims, 6 Drawing Sheets

DIGITAL CONTROL CIRCUIT FOR TUNING SYSTEMS WITH A PULSE DENSITY MODULATION DIGITAL TO ANALOG CONVERTER

BACKGROUND OF THE INVENTION

1. Field of the Invention

The present invention relates generally to digital control circuits for radio frequency tuning systems, and, in particular, to digital control systems for tuning television receivers.

2. Description of the Related Art

Equipment for receiving radio-frequency signals contains control facilities by means of which a local oscillator needed for frequency conversion is set to the desired frequency. As a rule, use is made of the voltage-dependent capacitance of tuning diodes to vary the frequency of HF oscillators within wide limits. In most cases, two or more tuning diodes, whose control characteristics are paired to assure tracking at different tuning voltages, are used simultaneously.

In modern equipment, the manual adjustment of the tuning voltage is being replaced more and more by digital control circuits, whereby long-term stability and accuracy of adjustment and reproducibility are considerably increased. Such control circuits employ voltage or frequency synthesis methods, the latter using a phase-locked loop, which makes it possible to set precise, arbitrary local-oscillator frequencies.

A publication by ITT Semiconductors entitled "SAA 1290, Remote-Control and Tuning IC for TV Receivers," issue July 1986, Order No. 6251-222-5E, describes a monolithic integrated digital control circuit for tuning systems of television receivers which includes a facility for generating a tuning voltage by the voltage synthesis method. The output signal is a pulse-density-modulated pulse train ("PDM") which produces a PDM signal with an amplitude of 33 Volts using external switching devices. This signal is smoothed by a multisection low-pass filter to obtain the time-invariant tuning voltage. Accordingly, this facility for generating the tuning voltage is a dynamic digital-to-analog convertor which forms the desired high-resolution analog signal from the stored data by means of a pulse-density modulator.

The control circuit described includes additional dynamic digital-to-analog convertors which derive low-resolution analog function control voltages (e.g., for volume or brightness control) from stored data. It further includes a timing and control unit for the individual sequences of operations. The data stored under different addresses in the digital memory unit can be read in, fetched, or changed via a data input device, such as an externally accessible data bus. The address is, for example, the respective television channel number, which is activated via a remote-control circuit.

Offenlegungsschrift DE-A No. 34 27 852 (corresponding to U.S. Pat. Nos. 4,595,910 and 4,544,911) discloses a digital control circuit for tuning systems in television receivers. The disclosed digital control circuit uses a frequency synthesis method, such as a phase-locked loop. In that circuit, too, the tuning voltage is generated by means of a dynamic digital-to-analog convertor. The pulse-density modulator—called "digital mark/space-ratio controller" in the Offenlegungsschrift—is an accumulating counter whose count input is supplied with a data word to be added, and whose overflow output provides the PDM signal. On a time average within a given period, the overflow signal occurs in a ratio equal to the numerical ratio of the data word to be added and the number of possible counts.

A disadvantage of such analog or digital PLL control loops in tuning systems is, that to suppress oscillations and smooth the tuning voltage, they require a low-pass filter with a very low cutoff frequency or an integrator which slows down the change from one frequency to another. This is disadvantageous where a single tuner is to be switched rapidly between several signal sources (e.g., during multipicture reproduction in a television receiver or in a frequency-diversity receiving device in an automobile radio). If the switching takes too long, part of the information will be lost. On the other hand, the use of multituner designs in entertainment-electronics equipment is precluded because of their high cost.

SUMMARY OF THE INVENTION

The present invention is intended to remedy this. Accordingly, an object of the invention as claimed is to provide a digital control circuit for tuning systems which permits fast conversion from one arbitrary frequency to another arbitrary frequency.

Another object of the invention is to provide a high-resolution dynamic digital-to-analog convertor for a digital control circuit. The high-resolution dynamic digital-to-analog convertor generates a tuning voltage whose output can be smoothed with a low-pass filter having a short time constant and a short response time.

A further object of the invention is to provide a digital control circuit for tuning systems in which as many functions as possible can be handled by existing functional elements. This is particularly important if the digital control circuit contains a programmable microprocessor which can perform these functions using microprogram sequences.

These objects are attained by the invention as claimed by pre-setting the existing digital low-pass filters in the tuning system, which have long time constants or exhibit integral action, to the steady-state value from a memory device on each frequency change.

An essential advantage of the invention is that the long response time of the filters is drastically reduced by presetting the low-pass filters to a value which is as close as possible to the steady-state final value. An added advantage is that the short response time is achieved without impairing the tendency toward oscillation. A particular advantage lies in the fact that the disregard of the response time of the low-pass filter practically represents an additional degree of freedom for the filter design. These and other advantages will also become apparent from the following detailed description of the embodiments illustrated in the accompanying drawings.

BRIEF DESCRIPTION OF THE DRAWINGS

The invention will now be explained in greater detail with reference to the accompanying drawings, in which.

DETAILED DESCRIPTION OF THE PREFERRED EMBODIMENT

Figure 1:
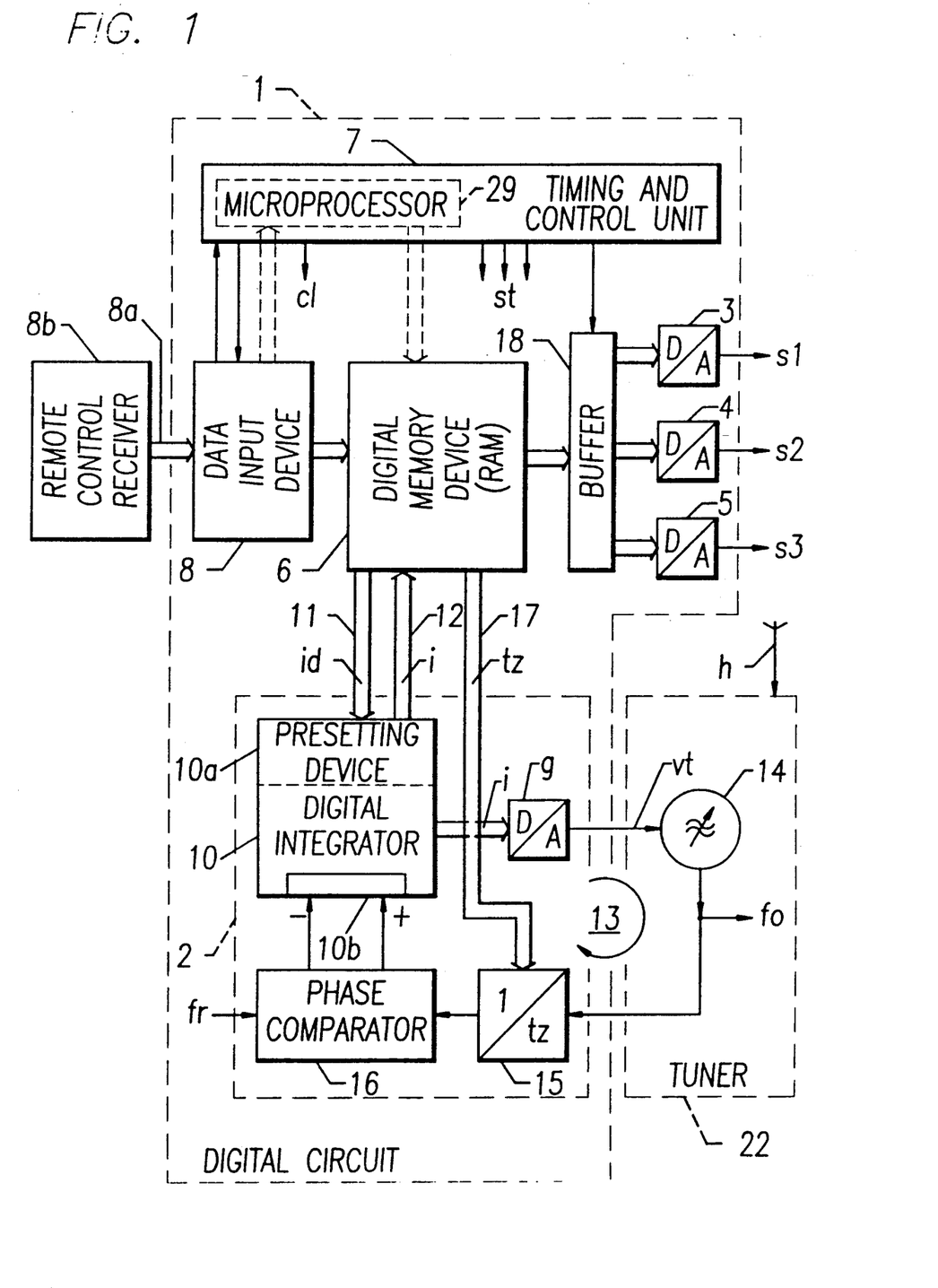
FIG. 1 is a block diagram of an embodiment of the digital control circuit in accordance with the invention.

FIG. 1 shows a basic embodiment of the invention in a block diagram. A digital control circuit 1 for radio-frequency tuning systems, particularly for television receivers, is connected via a data input device 8 to an external data bus 8a which has an external input from a remote-control receiver 8b. A variety of data is input into the digital control circuit 1 via the data input device 8. The data input into the digital control circuit 1 either serve to switch to another channel or vary function control voltages s1, s2, s3, such as volume, brightness, etc. This data controls a digital memory device 6 which reads the actual internal data/instructions from the selected locations. This memory device 6 is a random-access memory ("RAM"). The function control voltages s1, s2, s3 are provided by a first, second and third relatively low resolution digital-to-analog convertors 3, 4, 5. Although only three convertors are shown in the embodiment of FIG. 1, additional convertors can be included in other embodiments. Data is transferred from the digital memory device 6 to these digital-to-analog convertors via a buffer 18.

Figure 2:
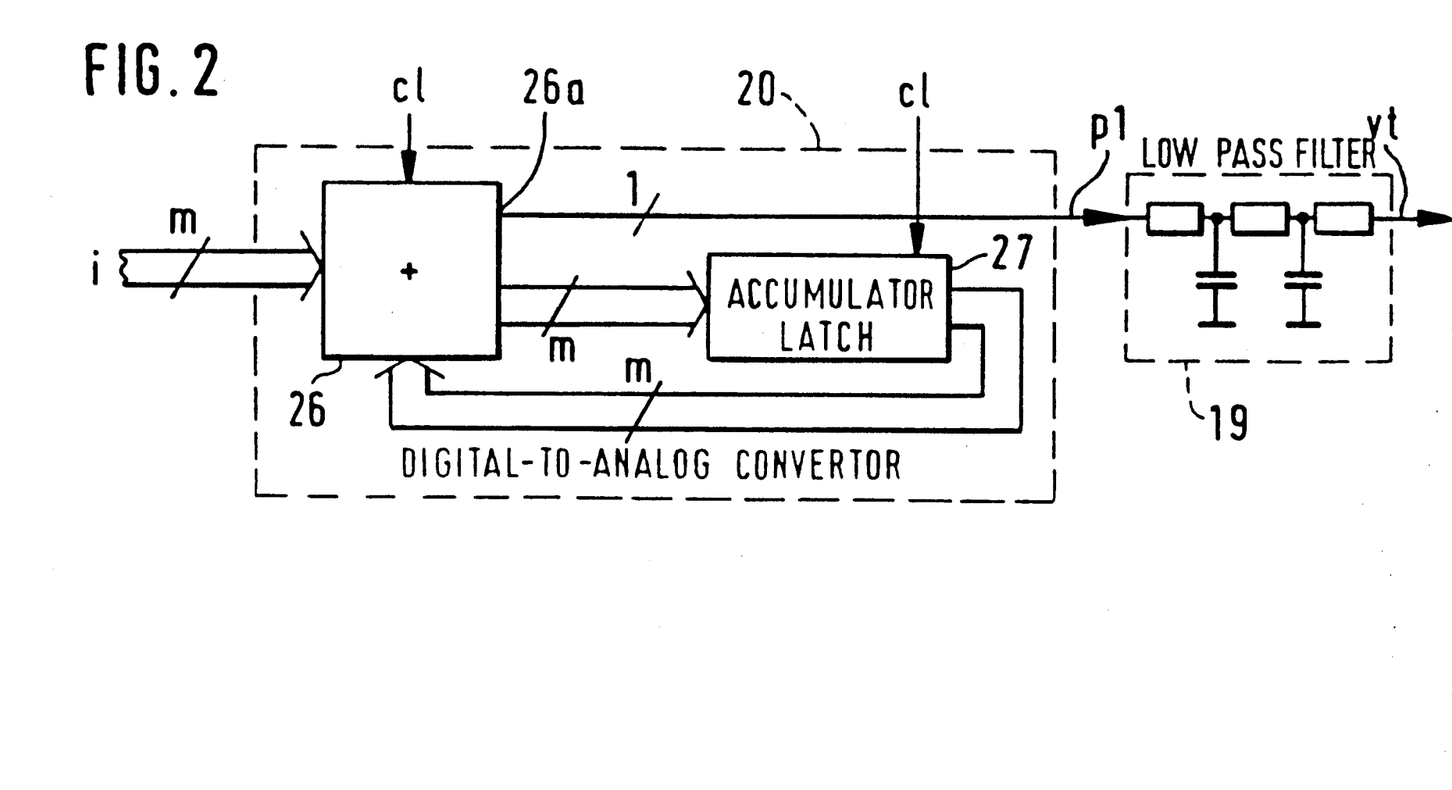
FIG. 2 shows schematically a prior art pulse-density modulator.

The central control function in the digital control circuit 1 is performed by a timing and control unit 7 which generates a plurality of control instructions st and a master clock cl for all sub-circuits. The digital control circuit 1 further includes a device 2 for generating a tuning voltage vt, which represents an essential functional section of the circuit. As is well-known, the tuning voltage vt must have a very high resolution in the range between 0.5 Volts and 33 Volts (e.g., 16 bits). This requires digital-to-analog convertors which are entirely different from those needed to generate the function control voltages. Accordingly, it is not advantageous to implement such a high-resolution digital-to-analog convertor as a static convertor with a monotonic characteristic. Therefore, the principle of the dynamic convertor shown in FIG. 2 is commonly applied by deriving a pulse-density-modulated signal ("PDM" signal), which is smoothed by means of an analog smoothing filter, from the digital tuning data. This smoothing filter in such a high-resolution dynamic digital-to-analog convertor must be a low-pass filter with a very low cutoff frequency, so that upon a frequency change, the response time may become long. This, however, conflicts with the above object of the invention.

As described above, the main reason for the slow rate of change of the tuning voltage vt lies in the low-pass filter or integrator of the phase-locked loop in frequency synthesis systems. The frequency synthesis system shown in FIG. 1 includes a phase-locked loop 13 comprising a tuner 22 and the device 2 for generating the tuning voltage vt. A tuner 22, which is shown schematically, includes a voltage-controlled oscillator ("VCO") 14, whose control input has the tuning voltage vt applied to it, and whose output provides a high-frequency signal of at the desired local frequency. An RF antenna signal h is applied to the input of the tuner 22. The oscillator signal of is applied to the signal input of a programmable frequency divider 15, whose control input is supplied with the divisor tz from the digital memory device 6. The output of the programmable frequency divider 15 is connected to the signal input of a phase comparator 16, whose reference input has a fixed-frequency reference signal fr applied to it. The reference signal fr may be derived from the system clock cl, for example. The divisor tz may also be a nonintegral number.

The output of the phase comparator 16, which provides an up or down signal, is connected to the corresponding increment/decrement input 10b of a digital integrator 10. The digital integrator 10 provides the respective integration value i (e.g., a 16-digit data value in binary notation) to a high-resolution digital-to-analog convertor 9, whose output provides the tuning voltage vt. The phase-locked loop 13 is thus complete.

The digital integrator 10 differs from that in the prior art systems in that it includes a presetting device 10a, which can preset the output of the digital integrator 10 to any predeterminable value at any time. This is done using a first data line 11 over which the preset data value id is applied as an input to the digital integrator 10 from the digital memory device 6. Advantageously, the value chosen as the preset data value id is the value which is equal to the steady-state integration value i when the phase-locked loop 13 has locked onto the correct local frequency. Because of the nonlinear characteristics of the tuning diodes, this integration value i must be determined in a separate measurement step. This is done, for example, during the first programming of the desired channel. The steady-state integration value i is transferred over the second data line 12 to the digital memory device 6, where it is stored under the address of this channel together with the associated divisor tz. When this channel is called up, the stored integration value i is transferred as the preset data value id over the first data line 11 to the presetting device 10a of the digital integrator 10. The phase-locked loop 13 is thus close to the steady state, and the frequency of the VCO 14 has been switched virtually without delay. If necessary, a slight correction is performed by applying few increments and/or decrements at the increment/decrement input 10b.

Without the presetting device 10a, the final integration value i would be reached only after a great number of increments or decrements. The response time would also be dependent on the step size of the tuning voltage vt. The first and second data lines 11, 12 can be combined into a single bidirectional data line.

For automatic station search, which is relatively slow, the presetting of the digital integrator 10 is not necessary because the integration value i is changed only by increments or decrements. Moreover, automatic station search generally takes place when the receiver is first programmed (i.e., when the digital memory device 6 does not yet contain any preset data values id).

The fourth digital-to-analog convertor 9 would ideally be a static convertor whose characteristic is monotonic and whose differential error is less than one LSB ("least significant bit"). Such a digital-to-analog convertor could drive the VCO 14 directly without an analog smoothing filter. In that case, the characteristic would not even have to be linear.

FIG. 2 is a block diagram of a dynamic digital-to-analog convertor, namely a prior art pulse-density modulator 20, which comprises an accumulator 26, 27 having an overflow output 26a. As an example, it is assumed that the integration value i represents an m-digit data word in binary notation, which is applied to the first data input of an m-bit adder 26. The m-bit output of this adder 26 is connected to the input of an accumulator latch 27 having its output coupled to the m-bit second input of the adder 26. The accumulator 26, 27 of the pulse-density modulator 20 is clocked by the system clock cl. The overflow output 26a of the adder 26 provides the pulse-density-modulated signal ("PDM" signal) p1.

Whenever the sum of the data applied to the m-bit adder 26 is greater than the m-digit data value in binary notation, a logic 1 is provided at the overflow output 26a. On the average, a logic 1 at the overflow output 26a occurs as often as the corresponding ratio of the applied integration value i to the maximum data value. The maximum data value is determined by the number of bits m. A low-pass filter 19 comprising several series-connected LC sections serves to smooth the PDM signal p1. The output of the smoothing low-pass filter 19 provides a constant tuning voltage vt. The time constant of the smoothing low-pass filter 19 depends directly on the period of the PDM signal p1. A higher resolution dynamic digital-to-analog convertor 20 will allow for a greater bit count m of the adder 26. A greater bit count of the adder 26 allows for a longer period of the PDM signal p1.

Figures 3, 4:
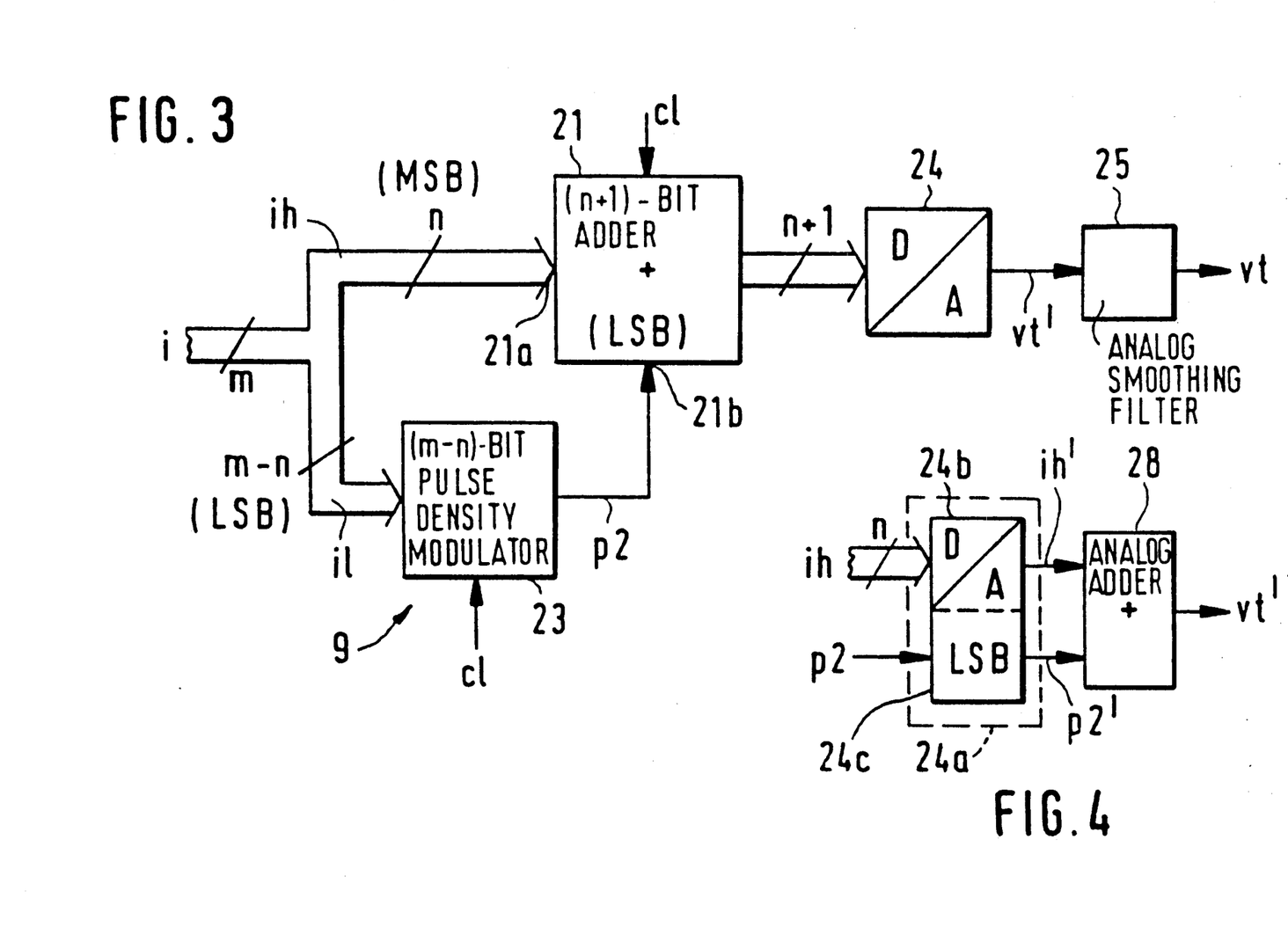
FIG. 3 is a block diagram of a preferred embodiment of the high-resolution digital-to-analog convertor of FIG. 1 which combines both the static conversion principle and the dynamic conversion principle.
FIG. 4 shows schematically a preferred embodiment of a sub-circuit of the circuit arrangement of FIG. 3.

FIG. 3 is a block diagram of a preferred embodiment of the dynamic digital-to-analog convertor 9 of FIG. 1 which, despite its high resolution, only requires an analog smoothing filter 25 with a short time constant that is preset by analog signals. The m-digit integration value i (in binary notation) is split into two data parts, with n high-order bits forming the high-order data part ih, and the remaining m-n bits forming the low-order data part il. The high-order data part ih is applied to the n terminals of the first data input 21a of an (n+1)-bit adder 21, the n+1 bits referring to the bit count of the output. The least significant bit of the high-order data part ih is connected to the LSB terminal of the first data input 21a. The low-order data part il is applied to an (m-n)-bit pulse-density modulator 23, whose PDM output signal p2 is applied to the second data input 21b, namely the LSB terminal, of the (n+1)bit adder 21. Since the sum of the high-order data part ih and the PDM signal p2 can reach a maximum of $2^n$, while only the value $2^n-1$ can be implemented with n bits, the output of the adder 21 must have n+1 bits.

A 16-bit (m=16) integration value i is advantageously divided so that the six high-order bits (n=6) are processed statically and the remaining ten low-order bits (m-n=10) dynamically.

If all possible $2^n$ values are to be digitized, an (n+1)-bit digital-to-analog convertor 24 is required. The output of this convertor 24 fluctuates by exactly one LSB at the pulse repetition rate of the PDM signal p2. These slight fluctuations can be easily eliminated by means of a smoothing filter 25 with a short time constant, which changes the unsmoothed tuning voltage vt' into a ripple-free signal.

The smoothing is assisted by the following two PDM-signal characteristics:

1. In the PDM signal p2, the ripple amplitude is only equal to the height of one LSB value, while in the unsmoothed PDM signal described in the above reference, the ripple amplitude is 33 Volts.

2. Because of the low bit-count m-n of the (m-n)-bit pulse density modulator 23, the period of the signal provided by this modulator is much shorter than that of the signal delivered by a pulse-density modulator with the full bit count m.

This method in accordance with the invention makes it possible to implement a high-resolution digital-to-analog convertor, which combines the static conversion principle for the coarse adjustment range and the dynamic conversion principle for the fine adjustment range, in an advantageous manner. Particular advantages are the low bit-count of the static digital-to-analog convertor 24 and the short time constant required to smooth the tuning voltage using a simple smoothing filter 25. By statically presetting the coarse adjustment range, analog presetting of the smoothing filter is effected.

Such a digital-to-analog convertor can also be advantageously used in the digital control circuit 1 for tuning systems in which the rapidly switchable tuning voltage vt is formed by the device according to the voltage synthesis method. As with the frequency synthesis method, the short time constant of the analog smoothing filter 25 then represents the only delay. This delay is not significant enough to be disturbing.

FIG. 4 shows schematically a preferred embodiment of a sub-circuit of the circuit arrangement of FIG. 3. Without changing the resolution of the tuning voltage vt, the (n+1)-bit digital-to-analog convertor 24 of FIG. 3 can be replaced with an n-bit digital-to-analog convertor 24a which is equipped with an additional, separate LSB stage 24c. In that case, the n bits of the high-order data part ih are applied directly to the input of the n-bit digital-to-analog convertor 24b, while the PDM signal p2 is applied to the input of the separate LSB stage 24c. The output of the n-bit digital-to-analog convertor 24b is a constant basic value ih', which is applied to the first input of an analog adder 28. The output of the separate LSB stage 24c provides a PDM signal p2' of correct amplitude, which is applied to the second input of the analog adder 28. The amplitude of the PDM signal p2' is exactly equal to the LSB level regardless of the level of the signal provided by the pulse-density modulator 23. The output of the analog adder 28 corresponds exactly to the unsmoothed tuning voltage vt' of FIG. 3.

In FIG. 5, the operation of the circuit arrangement of FIG. 3 or 4 is illustrated with the aid of a few exemplary signal waveforms. To simplify matters, it is assumed that m=4 and n=2 digits in binary notation. The applied integration value i is assumed to be the binary number 1101, which is equivalent to decimal 13. The high-order data part ih thus comprises the binary number 11 (decimal 3), and the low-order data part il of the binary number 01 (decimal 1).

Figure 5A:
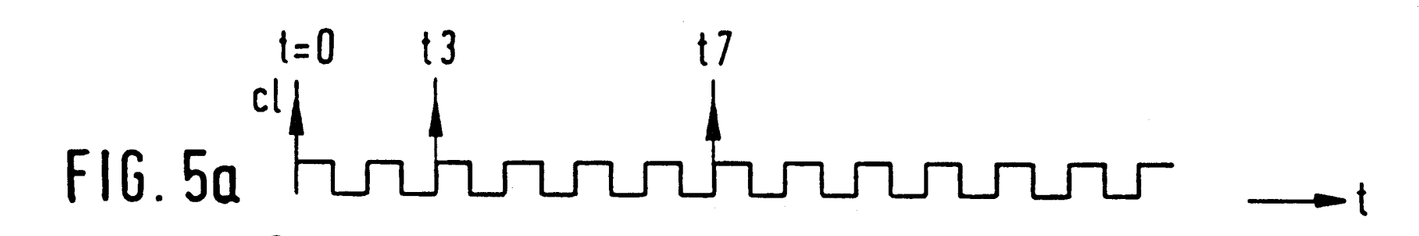
FIGS. 5A-5D show a few basic signal waveforms of the circuit arrangement of FIGS. 3 or 4.

The waveform shown in FIG. 5a is the system clock cl, which has a mark-space ratio of 1:1.

Figure 5B:
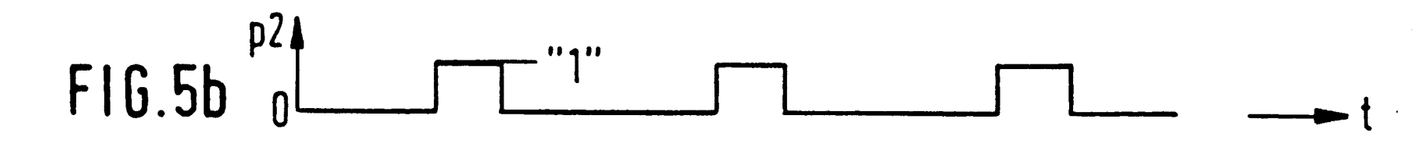

The waveform shown in FIG. 5b is the PDM signal p2 of the (m-n)-bit pulse-density modulator 23. In the example assumed above, the bit count of this modulator is 2 (i.e., m-n=2) so that four positions can be distinguished. At the instant t=0, the count of the pulse-density modulator 23 is assumed to be the binary number 01 (decimal 1). Thus, an overflow arises on the third clock pulse t3 and appears as a logic 1 in the PDM signal p2. This overflow appears after every four clock pulses. This corresponds to the ratio of the applied data value, namely decimal 1, to the number of possible discrete steps, namely four in the example shown.

Figure 5C:
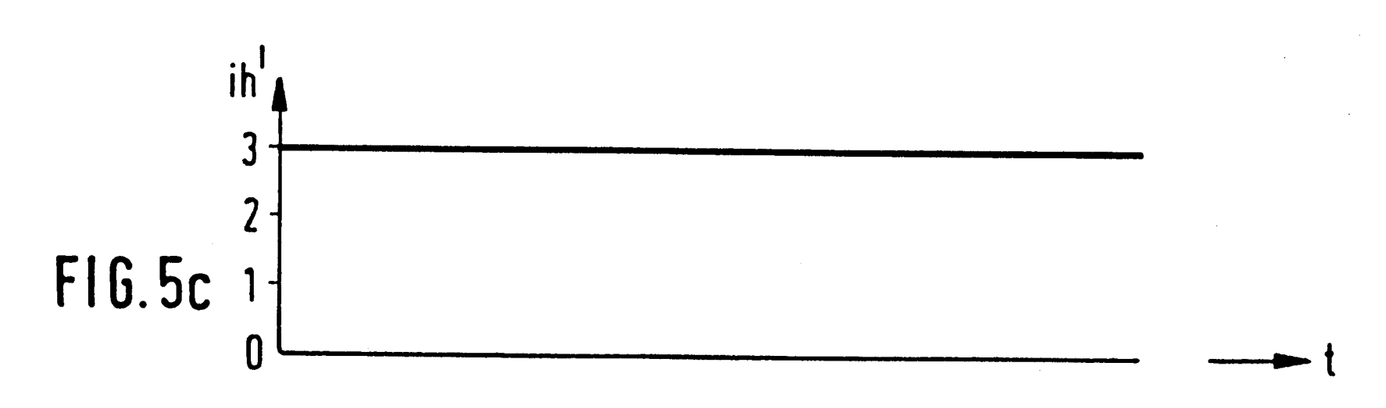

The diagram of FIG. 5c shows the constant basic value ih' with the decimal value 3. This constant basic value ih' is not present in the circuit arrangement of FIG. 3 as an actual signal but readily follows as an intermediate mental step from the high-order data part ih or directly as a signal from FIG. 4.

Figure 5D:
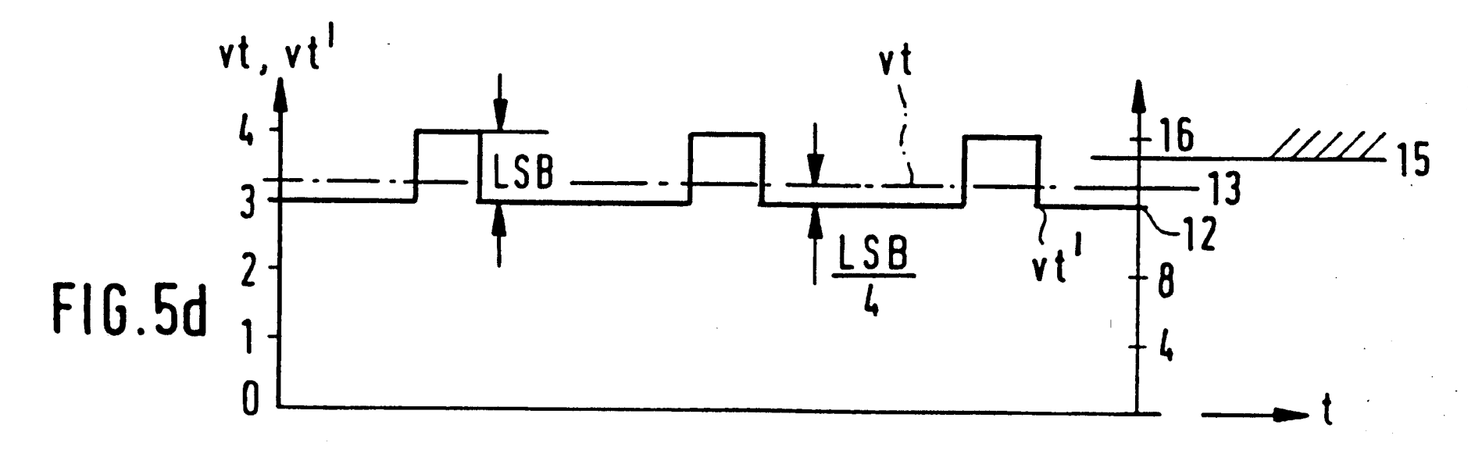

The waveform shown in FIG. 5d is the unsmoothed tuning signal vt' of FIGS. 3 and 4, which is the combination of the constant basic value ih' and the PDM signal p2' of correct amplitude. The constant basic value ih' and the PDM signal p2' of correct amplitude are contained as real signals only in FIG. 4. At the instants t3, t7, the unsmoothed tuning voltage vt' changes from the decimal value 3 by one LSB value to the decimal value 4. This repeats every four clock pulses. The smoothing involves taking the arithmetic mean, so that the tuning voltage vt, shown as a dash-dot line, is (LSB)/4 above the decimal value 3.

On the left-hand axis of FIG. 5d, the output values of the digital-to-analog convertors 24, 24a are shown as abscissa values in LSB units. On the right-hand abscissa, all output values of the convertor arrangement of FIG. 3 or FIG. 4 are numbered consecutively from 0 to 15 as discrete steps. In FIG. 5d, it can be seen that the unsmoothed tuning voltage vt' in FIGS. 3 and 4 may temporarily assume higher values than the maximum possible tuning voltage, which would correspond to the decimal value 15.

Figure 6:
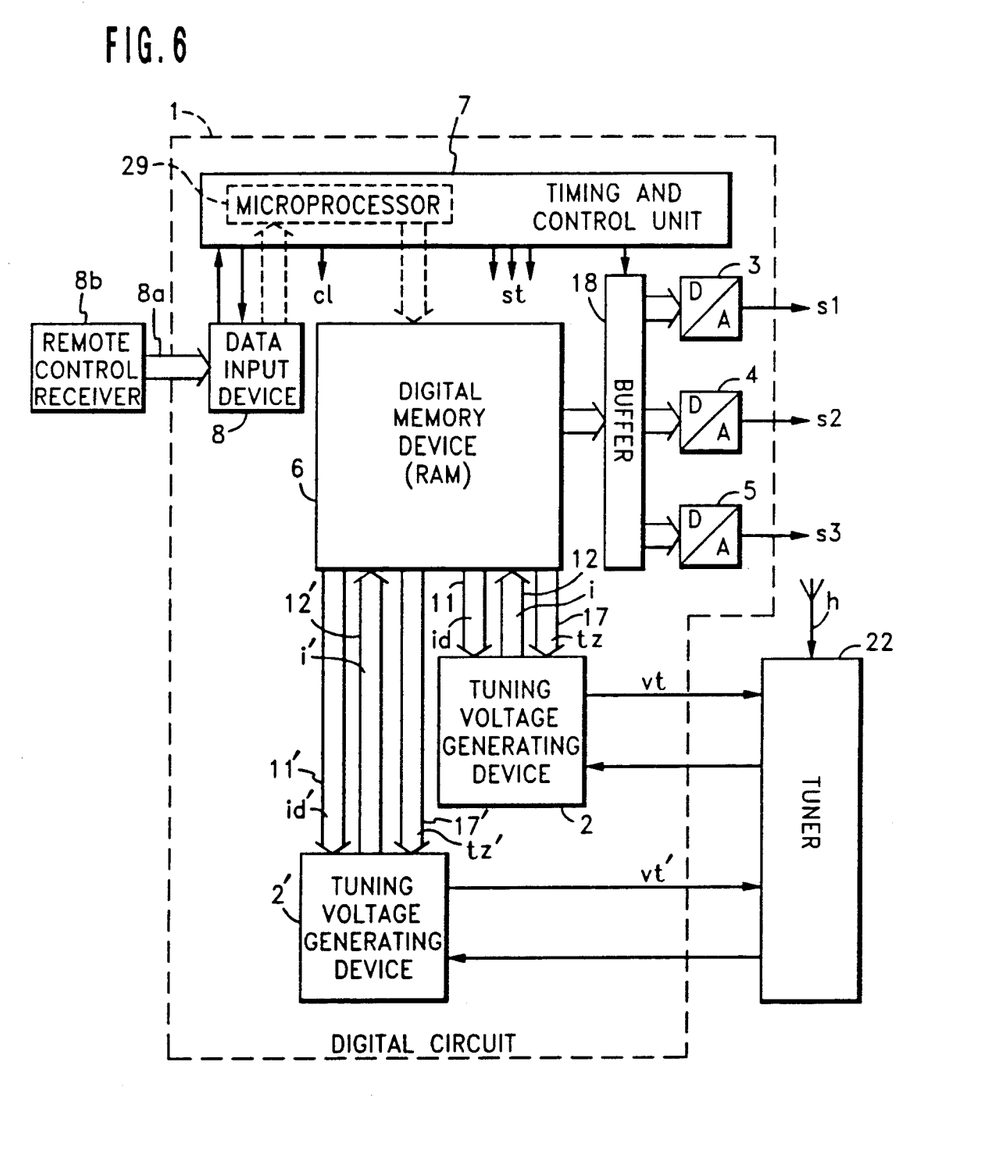
FIG. 6 illustrates a preferred embodiment of the digital circuit having a plurality of tuning voltage generating devices.

In a preferred embodiment of the invention, illustrated in FIG. 6, the digital control circuit includes plurality of devices 2 and 2' for generating different tuning voltages vt and vt', wherein each device 2 and 2' is interconnected with the memory device 6 via respective data lines 11 and 11', 12 and 12', and 17 and 17' to communicate the respective preset data values id and id', integration values i and i', and divisors tz and tz'. This permits the use of nonpaired tuning diodes, whose different tuning data are stored under a common address in the digital memory device 6. For each digital integrator 10 or digital low-pass filter, the respective preset data value id must then be stored under the same address.

To meet many different application requirements, it is advantageous to provide the timing and control unit 7 in the digital control circuit 1 with a programmable microprocessor 29, which controls, for example, the cyclic switching of the received channels during multichannel reception of television signals. The necessary data, such as channel numbers, reproduction sequence, dwell time or cycle duration, can then be entered as a program through the data input device. The use of a program makes it possible to cover a wide variety of applications by means of a single digital control circuit 1. This represents a very economical solution, particularly in consumer-electronics equipment.

It is also possible to operate digital functional units on a multiplex basis. Even more advantageously, these functional units are not implemented as hardware circuits but realized in software, namely as a microprogram, particularly where a microprocessor 29 is already present in the digital control circuit 1, as shown, for example, in FIG. 1. The computing speed of such a microprocessor is normally so high that it can readily perform such functions without introducing a noticeable delay. The digital integrator 10 and the first and second data lines 11, 12, for example, are then present only in the form of a microprogram which transfers data in the microprocessor between the memory and the arithmetic logic unit ("ALU"). The preset data value id is then written into the ALU. In like manner, the adder 21 and the pulse-density modulator 23 can be implemented as a microprogram sequence.

The amount of circuitry required can thus be kept small even if a great number of tuning voltages vt is to be generated. With the exception of the output stages of the digital-to-analog convertors 9, 24, 24a, the functional units are then either preset only once in physical form or realized in software.

What is claimed is:

1. A digital control circuit for tuning systems, comprising:
   a tuning voltage generating device that generates a tuning voltage, said tuning voltage generating device including:
      a first digital-to-analog convertor which provides said tuning voltage in response to an input; and
      a digital integrator that provides an integration value as said input of said first digital-to-analog convertor, said digital integrator including a presetting device having an input;
   a digital memory device that stores data for said tuning voltage, said digital memory device providing a preset data value as said input to said presetting device, said preset data value being equal to the steady-state value of said integration value at said tuning voltage;
   a timing and control unit; and
   a data input device; wherein said first digital-to-analog convertor comprises:
   an adder having an n-bit input, a least-significant-bit input, and an (n+1)-bit output, said n-bit input receiving said integration value from said digital integrator;
   a pulse density modulator having a data input that receives said integration value from said digital integrator and an output that provides said least-significant-bit input to said adder, said pulse density modulator being switched by a system cock;
   a first static digital-to-analog convertor having an input that receives said (n+1)-bit output from said adder and having an output; and
   an analog smoothing filter having an input connected to said output of said first static digital-to-analog convertor and having an output that provides said tuning voltage.

2. A digital control circuit as defined in claim 1, wherein said preset data value and the data for said tuning voltage associated with said preset data value are stored under the same address of said digital memory device.

3. A digital control circuit as defined in claim 2, wherein said integration value is also written into said digital memory device, said integration value being stored under the same address as said tuning voltage associated with said preset data value, said integration value serving as said preset data value when said same address of said digital memory device is accessed.

4. A digital control circuit as defined in claim 1, wherein said presetting of said digital integrator occurs on each selective change of said tuning voltage.

5. A digital control circuit as defined in claim 1, wherein said tuning voltage generating device is a frequency synthesis system with a phase-locked loop that includes said digital integrator and said first digital-to-analog convertor, said frequency synthesis system further comprising:

a voltage-controlled oscillator having a control input, said voltage-controlled oscillator implemented as a high-frequency local oscillator;

a programmable frequency divider; and a phase comparator having a reference input and an output, said reference input receiving a fixed-frequency reference signal;

wherein:

said digital integrator has an increment/decrement input, said increment/decrement input being connected to the output of said phase comparator; and said tuning voltage output of said first digital-to-analog convertor being connected to the control input of said voltage-controlled oscillator.

6. A digital control circuit as defined in claim 5, wherein presetting of said digital integrator is inhibited when said tuning voltage changes during search tuning, said integration value being changed only in response to fixed increments or decrements applied to said increment/decrement input.

7. A digital control circuit as defined in claim 1, wherein:

said first static digital-to-analog convertor comprises a statically converting coarse adjustment portion of said first digital-to-analog convertor; and said pulse density modulator comprises a dynamically converting fine adjustment portion of said first digital-to-analog convertor.

8. The digital control circuit as defined in claim 1, further comprising at least two additional digital-to-analog convertors that generate at least two function control voltages, said digital memory device further storing data for said function control voltages.

9. A digital control circuit as defined in claim 1, wherein said integration value of said digital integrator is encoded as an m-digit binary number.

10. A digital control circuit as defined in claim 9, wherein said integration value is divided into an n-bit high-order data part, and an (m-n)-bit low-order data part, said high-order data part of said integration value being applied to said n-bit input of said adder.

11. A digital control circuit as defined in claim 10, wherein said (m-n)-bit low-order data part of said integration value is coupled to the data input of said pulse-density modulator.

12. A digital control circuit as defined in claim 11, wherein the output of said pulse-density modulator is applied to the least-significant-bit input of said adder, said (n+1)-bit output of said adder being connected to the input of said first static digital-to-analog convertor.

13. A digital control circuit as defined in claim 12, wherein the output signal of said first static digital-to-analog convertor is smoothed by means of said analog smoothing filter, said analog smoothing filter having a short time constant, said smoothing filter, providing said tuning voltage, said tuning voltage having a resolution of $2^n - 1$ steps.

14. A digital control circuit as defined in claim 1, wherein said timing and control unit includes a programmable microprocessor, said microprocessor controllable via said data input device.

15. A digital control circuit as defined in claim 14, wherein said adder and said pulse-density modulator are implemented as programs within said microprocessor.

16. A digital control circuit as defined in claim 1, wherein said pulse-density modulator is implemented as an (m-n)-bit counter, said output of said pulse density modulator being an overflow output, said data input of said pulse density modulator receiving said low-order data part of said integration value, and said overflow output being applied to the least-significant-bit input of said adder.

17. A digital control circuit as defined in claim 1, further comprising a second tuning voltage generating device that generates a second tuning voltage in response to tuning data and preset data values stored in said digital memory device at a corresponding address with said preset data values and said tuning data for said first tuning voltage generating device.

18. A digital control circuit as defined in claim 1, wherein said timing and control unit includes a programmable microprocessor, said microprocessor controllable via said data input device.

19. A digital control circuit as defined in claim 18, wherein said digital integrator is implemented as a program within said microprocessor and said preset data value and said integration value are provided as input values to said program.

20. A digital control circuit for tuning systems, comprising:

a tuning voltage generating device that generates a tuning voltage, said tuning voltage generating device including:

a first digital-to-analog convertor which provides said tuning voltage in response to an input; and a digital integrator that provides an integration value as said input of said first digital-to-analog convertor, said digital integrator including a presetting device having an input;

a digital memory device that stores data for said tuning voltage, said digital memory device providing a preset data value as said input to said presetting device, said preset data value being equal to the steady-state value of said integration value at said tuning voltage;

a timing and control unit; and a data input device; wherein said first digital-to-analog convertor comprises:

a pulse density modulator having a data input and an output, said pulse density modulator being switched by a system clock;

a second static digital-to-analog convertor, said second static digital to analog convertor comprising:

a n-bit digital-to-analog convertor having an input that receives said integration value and having an output;

a separate LSB stage having an input connected to said output of said pulse density modulator and having an output;

an analog adder that adds the outputs from said n-bit digital-to-analog convertor and said separate LSB stage and provides an unsmoothed tuning voltage as an output; and an analog smoothing filter that receives said unsmoothed tuning voltage as an input and provides said tuning voltage as an output.

21. A digital control circuit as defined in claim 20, wherein said integration value is encoded as an m-digit binary number.

22. A digital control circuit as defined in claim 21, wherein said integration value is divided into an n-bit high-order data part, and an (m-n)-bit low-order data part.

23. A digital control circuit as defined in claim 22, wherein said n-bit high-order data part is applied to the input of said n-bit digital-to-analog convertor, and said output of said pulse-density modulator is applied to said LSB stage of said second static n-bit digital-to-analog convertor.

24. A digital control circuit as defined in claim 23, further including an analog adder having first and second inputs, the output of said n-bit digital-to-analog convertor being connected to said first input, the output of said separate LSB stage being connected to said second input, said analog adder providing an unsmoothed tuning voltage as an output.

25. The digital control circuit as defined in claim 20, further comprising at least two additional digital-to-analog convertors that generate at least two function control voltages, said digital memory device further storing data for said function control voltages.

26. A digital control circuit for tuning systems, said digital control circuit serving to switch channels in a television receiver during multichannel reception and simultaneous multipicture display, said digital control circuit comprising:
 a tuning voltage generating device that generates a tuning voltage, said tuning voltage generating device including:
  a digital integrator that provides an integration value, said digital integrator including a presetting device having an input; and
  a first digital-to-analog convertor which provides said tuning voltage in response to said integration value, said first digital-to-analog convertor comprising:
   a pulse density modulator having a data input and an output, said pulse density modulator being switched by a system clock;
   a second static digital-to-analog convertor, said second static digital to analog convertor comprising:
    an n-bit digital-to-analog convertor having an input that receives said integration value and having an output;
    a separate LSB stage having an input connected to said output of said pulse density modulator and having an output;
    an analog adder that adds the outputs from said n-bit digital-to-analog convertor and said separate LSB stage and provides an unsmoothed tuning voltage as an output; and
    an analog smoothing filter that receives said unsmoothed tuning voltage as an input and provides said tuning voltage as an output;
  a digital memory device that stores data for said tuning voltage, said digital memory device providing a preset data value as said input to said presetting device, said preset data value being equal to the steady-state value of said integration value at said tuning voltage;
  a timing and control unit; and
  a data input device.

27. A digital control circuit as defined in claim 26, wherein cyclic switching of the received channels is controlled by said timing and control unit.

* * * * *